United States Patent
Ram et al.

(10) Patent No.: US 10,690,547 B2
(45) Date of Patent: Jun. 23, 2020

(54) SYSTEM AND METHOD FOR MEASURING POWERLINE TEMPERATURE BASED ON SELF-POWERED POWER SENSORS

(71) Applicant: Panoramic Power Ltd., Kfar-Saba (IL)

(72) Inventors: Yaron Ram, Holon (IL); Yehoshua Rosenberg, Nokdim (IL); Adi Shamir, Kidron (IL)

(73) Assignee: Panoramic Power Ltd., Kfar-Saba (IL)

(*) Notice: Subject to any disclaimer, the term of this patent is extended or adjusted under 35 U.S.C. 154(b) by 0 days.

(21) Appl. No.: 16/046,164

(22) Filed: Jul. 26, 2018

(65) Prior Publication Data
US 2019/0310139 A1    Oct. 10, 2019

Related U.S. Application Data

(60) Provisional application No. 62/652,353, filed on Apr. 4, 2018.

(51) Int. Cl.
| | | |
|---|---|---|
| *G01K 1/02* | (2006.01) | |
| *G08B 21/18* | (2006.01) | |
| *G01R 19/00* | (2006.01) | |
| *G01K 3/00* | (2006.01) | |

(52) U.S. Cl.
CPC ........... *G01K 1/024* (2013.01); *G01K 3/005* (2013.01); *G01R 19/0092* (2013.01); *G08B 21/182* (2013.01)

(58) Field of Classification Search
CPC ..... G01K 1/024; G01K 3/005; G01M 3/3272; G01R 15/186; G01R 19/0092; G01R 19/2513; G01R 21/133; G01R 21/14; G01R 22/063; G08B 21/182; H04W 56/001; H04W 56/0065
USPC ........................................................ 340/584
See application file for complete search history.

(56) References Cited

U.S. PATENT DOCUMENTS

| | | | | |
|---|---|---|---|---|
| 3,398,368 | A | * | 8/1968 | Young .................. G01R 15/005 318/490 |
| 5,326,173 | A | | 7/1994 | Evans et al. |
| 5,892,430 | A | * | 4/1999 | Wiesman ................ H02J 50/10 340/538.16 |
| 6,817,756 | B2 | | 11/2004 | Raum et al. |
| 7,620,517 | B2 | | 11/2009 | Scholtz et al. |

(Continued)

FOREIGN PATENT DOCUMENTS

| | | |
|---|---|---|
| CN | 106774053 A | 5/2017 |
| RU | 2514788 C1 | 5/2014 |

OTHER PUBLICATIONS

Munley "Bare Overhead Transmission Conductor Ratings", Transmission and Substation Design Subcommittee, Conductor Rating Task Force, PJM interconnection LLC, Nov. 2000, 174 pages (Year: 2000).*

(Continued)

*Primary Examiner* — Stephen R Burgdorf (74) *Attorney, Agent, or Firm* — M&B IP Analysts, LLC (57) ABSTRACT

A system and method for measuring powerline temperature based on self-powered power sensors (SPPS), including: retrieving a powerline current reading and an SPPS temperature reading from an SPPS; determining a powerline temperature based on an isothermal curve of the powerline current reading and the SPPS temperature reading; and generating an alert when the powerline temperature exceeds a predetermined threshold.

11 Claims, 4 Drawing Sheets

(56) References Cited

U.S. PATENT DOCUMENTS

| | | | |
|---|---|---|---|
| 8,184,015 B2* | 5/2012 | Lilien | H02G 1/02 |
| | | | 340/870.04 |
| 9,134,348 B2 | 9/2015 | Shamir | |
| 9,383,394 B2* | 7/2016 | Banting | G01R 15/14 |
| 9,602,043 B2 | 3/2017 | Reddy et al. | |
| 9,678,113 B2 | 6/2017 | Shamir et al. | |
| 9,678,114 B2 | 6/2017 | Shamir et al. | |
| 9,891,252 B2 | 2/2018 | Shamir et al. | |
| 2012/0197558 A1* | 8/2012 | Henig | G01K 11/265 |
| | | | 702/58 |
| 2014/0180616 A1* | 6/2014 | Aaserude | G01R 27/02 |
| | | | 702/65 |
| 2014/0266237 A1* | 9/2014 | Lindsey | G01R 31/08 |
| | | | 324/512 |
| 2016/0178681 A1* | 6/2016 | Lilien | G01R 31/021 |
| | | | 702/64 |
| 2018/0238955 A1* | 8/2018 | Bango | H04W 84/00 |
| 2018/0316219 A1* | 11/2018 | Bliss | H02J 13/0017 |
| 2018/0335456 A1* | 11/2018 | Cook | G01D 3/08 |

OTHER PUBLICATIONS

International Search Report and Written Opinion of International Searching Authority for PCT/US2018/043899, ISA/RU, Moscow, Russia, dated Dec. 4, 2018.

\* cited by examiner

SYSTEM AND METHOD FOR MEASURING POWERLINE TEMPERATURE BASED ON SELF-POWERED POWER SENSORS

CROSS-REFERENCE TO RELATED APPLICATIONS

This application claims the benefit of U.S. Provisional Application No. 62/652,353 filed on Apr. 4, 2018, the contents of which are hereby incorporated by reference.

TECHNICAL FIELD

The present disclosure relates generally to powerlines and self-powered power sensors (SPPSs), and more specifically to determining a powerline temperature based on current and temperature readings of an SPPS.

BACKGROUND

Overheating of power lines can be dangerous for a number of reasons. First and foremost, overheated lines can cause fires, both on the line itself as well as within surrounding environments, including equipment, housings, fixtures, buildings, and the like. Further, the heat from the overheating itself can cause damage to the lines and equipment even absent an actual fire, requiring expensive repairs and disruptive down time of associated power connections.

Powerlines may extend considerable distances, and at certain sections may be routed through various combustible materials. For example, within a facility, powerlines may enter and crisscross the facility within walls and alongside equipment, conducting heat throughout. While some powerlines are protected with insulation, as the temperature of a powerline increases, the insulation may become irreparably damaged. This typically happens when a plastic insulating layer surrounding the conducting wire of the powerline breaks down and becomes brittle. In some cases a breakdown of insulation is invisible and cannot be easily detected. For many common materials, this breakdown change occurs around 70° C. Heat damage and fire often result from such a breakdown.

Fire and smoke detectors are known tools used to provide an alert when the presence of smoke or flames are identified. However, both devices are limited in providing detection that is at a relatively late stage in an emergency situation, namely after actual smoke or fire has been produced, when often significant damage has already occurred. This is particularly true with damages due to compromised powerlines, as these may be hidden from view for extended periods of time prior to being detected. Even with fire and smoke detectors, it can be difficult to detect a fire that is developing within isolated conduits of powerlines, and even more difficult to create an alert warning of a potential fire situation that has not yet occurred. A simple and direct measurement of the temperature of a powerline, for example by using an attached thermocouple, is often not effective, as the powerlines naturally and safely heat up with increased current flowing therethrough, so long as the temperature is within safe limits, making it difficult to determine a potential dangerous situation. Additionally, uneven distribution of heat, based on powerline surroundings, can pose a challenge to the accuracy of such measurements.

It would therefore be advantageous to provide a solution that would overcome the challenges noted above.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "certain embodiments" may be used herein to refer to a single embodiment or multiple embodiments of the disclosure.

Certain embodiments disclosed herein include a method for measuring powerline temperature based on self-powered power sensors (SPPS), including: retrieving a powerline current reading and an SPPS temperature reading from an SPPS; determining a powerline temperature based on an isothermal curve of the powerline current reading and the SPPS temperature reading; and generating an alert when the powerline temperature exceeds a predetermined threshold.

Certain embodiments disclosed herein also include a non-transitory computer readable medium having stored thereon instructions for causing a processing circuitry to perform a process for measuring powerline temperature based on self-powered power sensors (SPPS), the process including: retrieving a powerline current reading and an SPPS temperature reading from an SPPS; determining a powerline temperature based on an isothermal curve of the powerline current reading and the SPPS temperature reading; and generating an alert when the powerline temperature exceeds a predetermined threshold.

Certain embodiments disclosed herein also include a system for measuring powerline temperature based on self-powered power sensors (SPPS), including: a processing circuitry; and a memory, the memory containing instructions that, when executed by the processing circuitry, configure the system to: retrieve a powerline current reading and an SPPS temperature reading from an SPPS; determine a powerline temperature based on an isothermal curve of the powerline current reading and the SPPS temperature reading; and generate an alert when the powerline temperature exceeds a predetermined threshold.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

Figure 1:
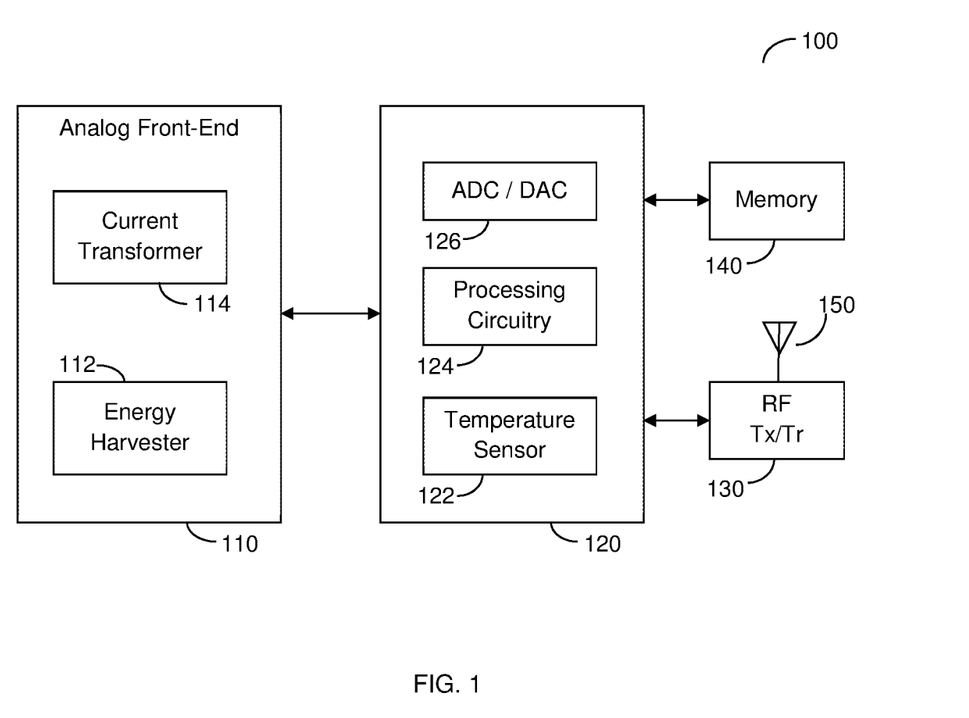
FIG. 1 is a schematic diagram of a self-powered power sensor (SPPS) utilized according to an embodiment.

FIG. 1 is a schematic diagram of a self-powered power sensor (SPPS) 100 utilized according to an embodiment to provide overheating alerts. The SPPS 100 may be housed in an appropriate housing (not shown).

The SPPS 100 includes an analog front-end section 110 that is connected to a microcontroller unit 120. The analog section 110 includes a current transformer 114 configured to transform electrical current, e.g., input from a powerline, to a lower current, where the current transformer may be placed around the powerline. The power from the current transformer 114 is used for two purposes: to provide the power needed for the operation of the SPPS 100, and to detect the power consumption of a load connected to a power line (not shown). The amount of current flowing through the transformer is measured to determine the power consumption. The analog section 110 further includes an energy harvester 112 configured to store energy to be used as the power supply for the circuitry of SPPS 100.

The microcontroller unit (MCU) 120 includes a processing circuitry 124, a temperature sensor 122, and at least one analog-to-digital converter (ADC) or digital-to-analog converter (DAC) 126. These converters are used for the conversion of analog signals into digital information (the operation of a ADC) or for the purpose of receiving digital information and converting it into an analog signal (the operation of a DAC). A conversion of an analog signal to digital signals allows the processing circuitry 124 to function as a digital signal processor to process the signal in a digital manner, and then, if necessary, create an analog signal by feeding the DAC with digital information resulting from such processing.

The processing circuitry 124 may be realized as one or more hardware logic components and circuits. For example, and without limitation, illustrative types of hardware logic components that can be used include field programmable gate arrays (FPGAs), application-specific integrated circuits (ASICs), application-specific standard products (ASSPs), system-on-a-chip systems (SOCs), general-purpose microprocessors, microcontrollers, digital signal processors (DSPs), and the like, or any other hardware logic components that can perform calculations or other manipulations of information.

A memory 140 is coupled to the MCU 120 that can be used as scratch pad memory as well as memory for storage of a plurality of instructions that, when executed by the MCU 120, perform the methods discussed herein. The memory 140 may comprise random access memory (RAM), read only memory (ROM), non-volatile memory (NVM), or other memory types and any combinations thereof. In an embodiment, the memory 140 is further configured to store software. Software shall be construed broadly to mean any type of instructions, whether referred to as software, firmware, middleware, microcode, hardware description language, or otherwise. Instructions may include code (e.g., in source code format, binary code format, executable code format, or any other suitable format of code). The instructions cause the processing circuitry 124 to perform the various processes described herein.

In an embodiment, the MCU 120 is further equipped with a temperature sensor 122. The temperature sensor 122 may be integral to the MCU 120. Such an integral temperature sensor 122 is typically provided as part of the MCU 120 to allow monitoring of its temperature, but, as will be further explained, can assist in measuring the powerline temperature. In another embodiment such a temperature sensor 122 can be electrically connected to the MCU 120. The temperature sensor 122 may include a thermometer, a thermocouple, an infrared sensor, and similar devices configured to measure the direct temperature a powerline.

A radio frequency (RF) transceiver 130 is coupled to the MCU 120 and to an antenna 150 to provide one or two-way communication with a management unit (not shown). In one embodiment, the RF transceiver 130 is configured to support transmission only, i.e., uplink communication. However, in an embodiment, the RF transceiver 130 may include a receiver portion to support features such as, and without limitation, detecting a carrier signal, clock synchronization, acknowledgement, firmware download, and configuration download. Typically, the RF transceiver 130 is configured to operate over an unlicensed industrial scientific medical (ISM) band, operative, for example, over the 2.4 GHz band.

In one configuration, some form of a spread-spectrum modulation technique may be employed by the RF transceiver 130, e.g., direct sequence spread spectrum (DSSS), to enable better coexistence with other systems working in the same environment. The communication rate, discussed in more detail below, should be sufficiently high to enable coexistence of a couple of hundred SPPSs in a single electrical closet, while the power consumption of the RF transceiver 130 should be low enough to adhere to energy harvesting limitations.

The RF transceiver 130 is further configured to support a communication range sufficient to operate in an electrical closet, e.g., 3-4 meters of a metallic rich environment. In an embodiment, the range may reach up to tens of meters in an indoor environment. This enables the placing of SPPSs on powerlines carrying current for individual devices, e.g., on powerlines of machines in a production line of a factory, or powerlines carrying current supplies to multiple loads. The RF transceiver 130 preferably uses a standard physical (PHY) layer supporting, for example and without limitations, IEEE 802.15.4, or other communication protocols, e.g., Zigbee. Use of such standards enables easy integration with existing systems that already include wireless hardware, such as smart meters.

A further description of an SPPS can also be found in U.S. Pat. No. 9,678,113, "Apparatus and methods for power consumption measurement at circuit breaker points," and assigned to the common assignee (hereinafter "the '113 patent"), which is hereby incorporated by reference.

In an embodiment, circuitry of the SPPS 110 utilizes an energy harvester 112 of the analog section 110 to harvest ample energy such that the MCU 120 may begin operation and periodically sample the current signal provided from the current transformer 114 using the ADC/DAC 126, as well as periodically sample the temperature read by temperature sensor 122.

In an embodiment, when sufficient samples are available, these may be transmitted, provided ample energy is present within the energy harvester, using the RF transceiver 130. The data can be transmitted in a single packet of data that may contain various types of information and include a unique identification (UID) of the SPPS, which enables a management unit to positively associate the current data received with previous data handled by the management unit with respect to that specific SPPS 100. Information may include, without limitations, various SPPS 100 status information, hardware version, software version, alerts such as overload, phase information, average current, temperature measured by the temperature sensor 122, time duration information, power off indication, e.g., upon identification that the load was turned off, and other system parameters.

In an embodiment, such parameters may be saved until such time of transmission the memory 140, and more specifically in a NVM portion of the memory 140. A cyclic redundancy code (CRC) calculation, forward error correction (FEC), or data redundancy may be further added to a packet for data validation at the receiver side. In one embodiment, when the voltage of the harvesting circuitry is determined to be decreasing at a high rate, i.e., if the power line load was turned off, the device transmits a message containing some or all of the last measured information values as no energy may be available until the load is switched on again.

Figure 2:
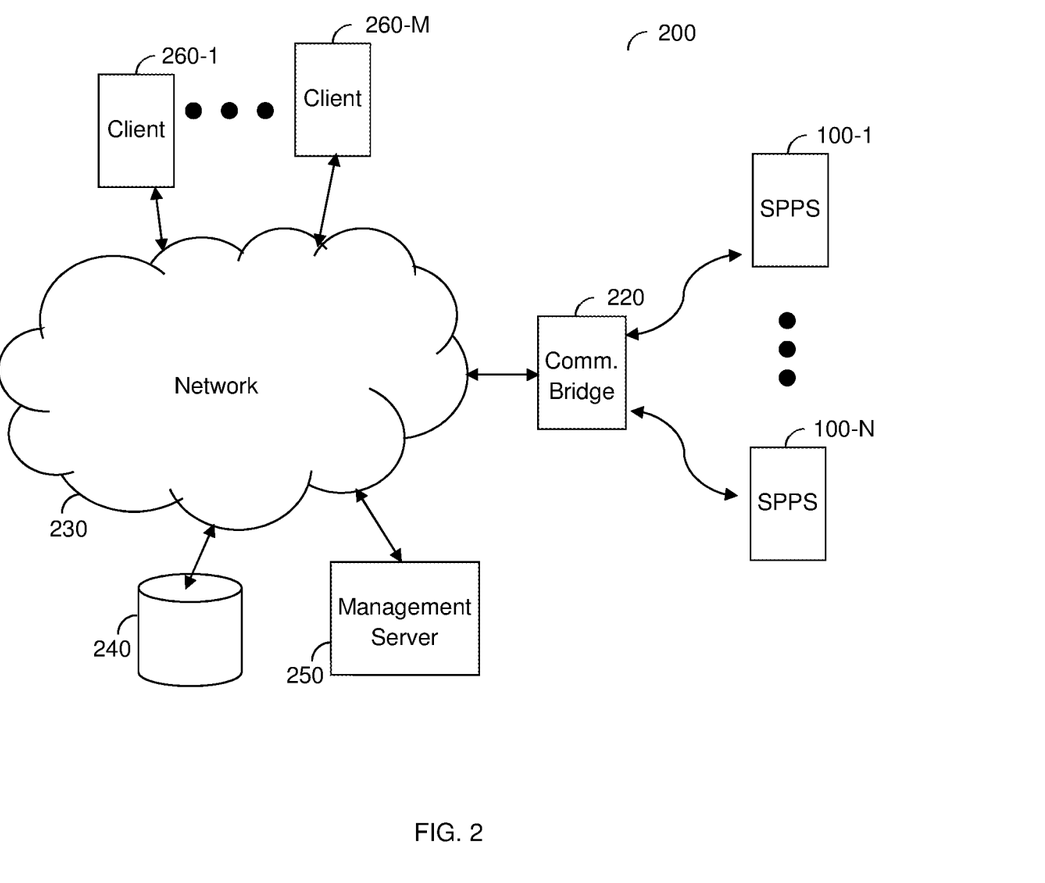
FIG. 2 is a network diagram of an SPPS system configured with a plurality of SPPS utilized according to an embodiment.

FIG. 2 is a network diagram of an SPPS system 200 configured with a plurality of SPPS and utilized according to an embodiment to measure powerline temperature. The system 200 includes SPPSs 100-1 through 100-N, where N is an integer greater than or equal to 1, (hereinafter referred to as SPPS 100 or SPPSs 100 for brevity) communicatively coupled to a communication bridge 220.

The SPPSs 100 may be placed in an electrical closet before or after respective circuit breakers with respect to a powerline, at the input to a specific power consuming unit or any respective power line which may represent one or more devices, or at any other accessible point on a powerline, such that the current transformer, e.g., current transformer 114 of FIG. 1, of the SPPS 100 is placed around a powerline for proper operation.

A communication bridge 220 is equipped with a transceiver (not shown), enabling communication with the plurality of SPPSs 100 using one or more of the communication schemes discussed herein. The communication bridge 220 is configured to communicate with the SPPSs 100 using unique identification UID labels, such as a MAC address or similarly identifying information. The communication bridge 220 is coupled to a network 230 which may be, but is not limited to, a local area network (LAN), a wide area network (WAN), a metro area network (MAN), the Internet, the worldwide web (WWW), the likes and combinations thereof.

The communication link can be, but is not limited to, a Wireless LAN (WLAN), e.g., over an 802.11 specification, also known as WiFi, a wireless sensor area network, for example over an 802.15.4 specification, also known as Zigbee, power line communication (PLC), or a cellular to modem network such as GPRS, GSM, LTE or CDMA. In one embodiment, the communication link aggregates the data from the plurality of SPPSs 100 prior to sending the aggregated data to the network. The network is further connected to a database 240 configured to store data sent by the communication bridge 220. While a single communication bridge 220 is shown in FIG. 2, this should not be viewed as limiting, as multiple communication bridges 220 may be used as may be deemed necessary to communicatively connect with the plurality SPPSs 100. A management server 250 is further connected to the network 230 and is configured to access data accumulated in the database 240, and to communicate with client device 260-1 260-1 through 260-M, where M is an integer greater than or equal to 1, and to process information based on any collected data. The management server 250 may be further used to determine and initiate alerts as discussed herein below. Any additional information regarding such a system is discussed in more detail in the '113 patent.

Figure 3:
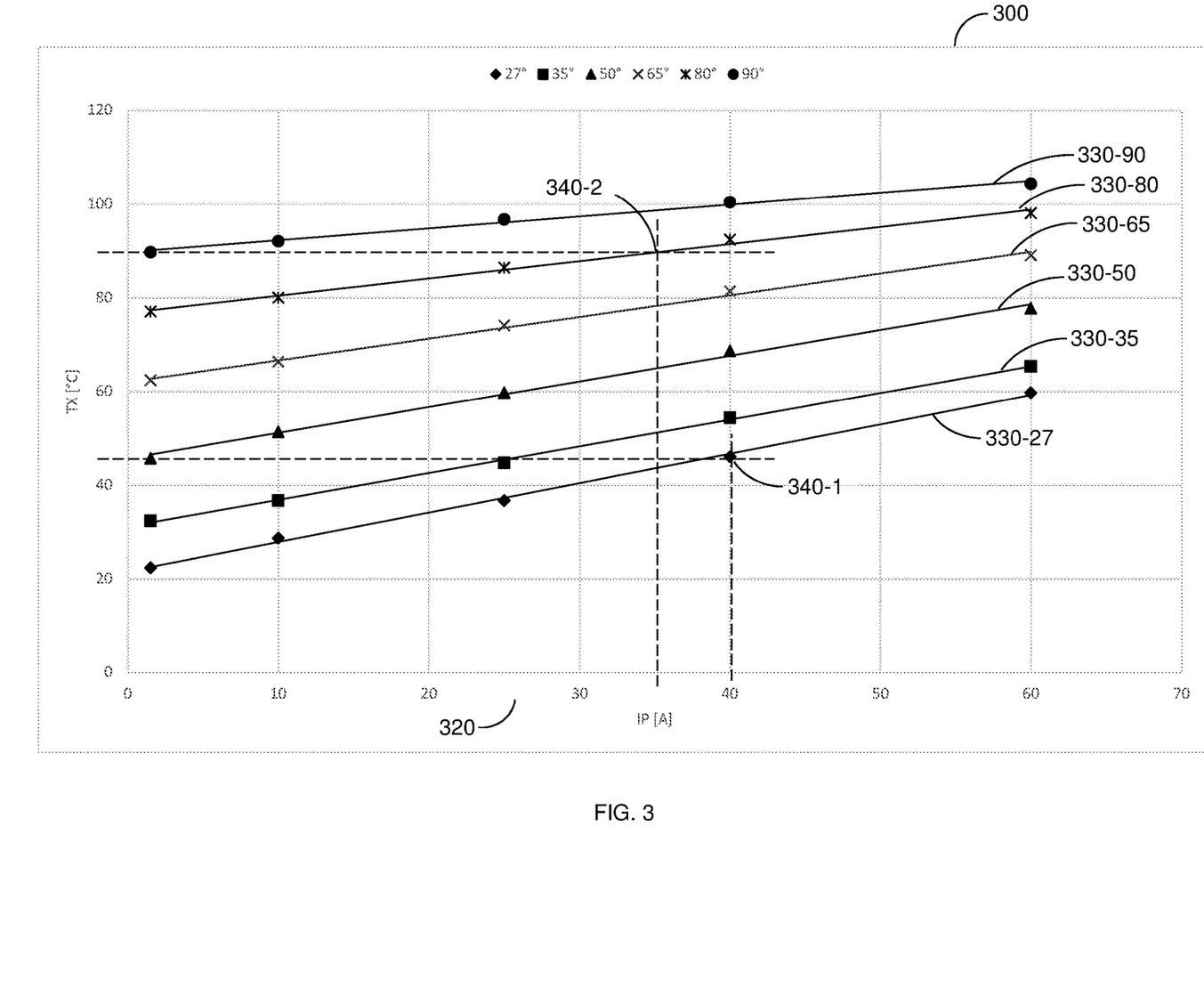
FIG. 3 is a chart demonstrating a plurality of isothermal curves used to determine powerline temperatures according to an embodiment.

Referring now to FIG. 3, there is shown a chart 300 of a plurality of isothermal curves 330 used to determine powerline temperatures according to an embodiment. The SPPS system is calibrated to generate reference isothermal curves 330-N, where N represents the powerline temperature in degree Celsius, where each isothermal curve 330 corresponds to a particular temperature of the powerline based on a detected current level that is measured by the SPPS 100. For example, the isothermal curve 330-27 corresponds to a powerline temperature of 27° C., while isothermal curve 330-65 corresponds to a powerline temperature of 65° C.

In the chart 300, the x-axis corresponds to the current measured by the SPPS 100 flowing through the powerline being measured, and the y-axis corresponds to the temperature measure by the temperature sensor 122 of the SPPS 100. During a calibration period, a plurality of temperature measurements may be taken by both the SPPS 100 and another temperature sensor, for example a thermocouple, to measure the temperature of the powerline at a variety of current levels flowing through the powerline. After a predetermined number of readings, the slope of an isothermal curve may be determined, and missing data may be extrapolated. In an embodiment, an isothermal curve is based on at least two data points, where each data point includes a powerline reading and an SPPS 100 temperature reading.

It should be appreciated that such calibrations can also be updated periodically, if determined to be necessary. The chart 300 may be used, for example, to determine that the powerline temperature of a powerline conducting 40 amps and a temperature sensor 122 reading of 45° C., both provided by an SPPS 100, which meet at point 340-1 on the chart 300, is 27° C. Similarly, according to displayed chart 300, the powerline temperature of a powerline conducting 35 amps and a temperature sensor 122 reading of 90° C., both provided by SPPS 100, intersecting at point 340-2, is 80° C. In one embodiment, the curves 330 may be adjusted for a particular SPPS 100, to compensate for the position of the SPPS 100 on the powerline with respect to a circuit breaker associated thereto.

In one embodiment, the calibration process to generate the chart 300 of the isothermal curves 330 is conducted at a manufacturing source of the SPPSs 100 and an customized chart can be generated for each individual SPPS 100. In an alternative embodiment, an average calibration curve is produced by measuring one or more SPPS 100 units, for example a sample of units per each production batch, and applying that curve to an entire set of SPPSs 100.

It should be noted that that as the temperature of the powerline increases, so does the risk of fire or heat-caused damage. Using data collected by the disclosed system would therefore allow determination of when such risks are increasing. Additionally, the system may be configured to automatically issue warnings, alerts and calls for actions when a predetermined threshold is breached. The system, using, e.g., the management server 250 of FIG. 1, may be programmed with various rules. For example, a temperature of above 90° C. for over three hours may be an indication that a potential fire hazard is developing.

In an embodiment, a rule can be established that measuring a temperature exceeding a predetermined threshold temperature for a predetermined period of time requires the issuance of an alert. In another exemplary case, a temperature exceeding 70° C. for over a twenty-four hours period should also be investigated and therefore the system is configured to generate an alert as well. Other temperature trends may also be investigated, such as a trend of a temperature increase over a period of time that exceeds certain limits may indicate a developing fire hazard and therefore generate an alert. For example, an alert may be generated if the powerline temperature increases relative to the average of a past predetermined period of time by a certain percentage or a certain number of standard deviations.

In a further embodiment, the powerline temperature that is measured is a three-phase powerline, where SPPS temperature readings are determined based on temperature measurement for each of A, B and C phases of the three-phase powerline. A possible indication of a potential fire hazard may be determined as a result of a different temperature measurement for each of the A, B and C phases of a three-phase powerline. Typically these powerlines should each have the same operating temperature, as they should be loaded equally, specifically when the load is a balanced load, such as an electric motor. If temperatures measured for one phase is significantly different from the other phases, for example phase A is significantly warmer than the phases B and C, this may require a generation of an alert of a fire hazard. For example, an alert may be generated when the temperature of one of the phases of the powerline, operating at a specific current, is at least ten degrees higher than the other powerline phases for a predetermined period of time. It should be noted that this could be used in any kind of multi-phased power supply system, and is not limited the a 3-phase powerline. Moreover, comparisons may be made between two different powerlines even if they are on the same phase without departing from the scope of the invention.

Figure 4:
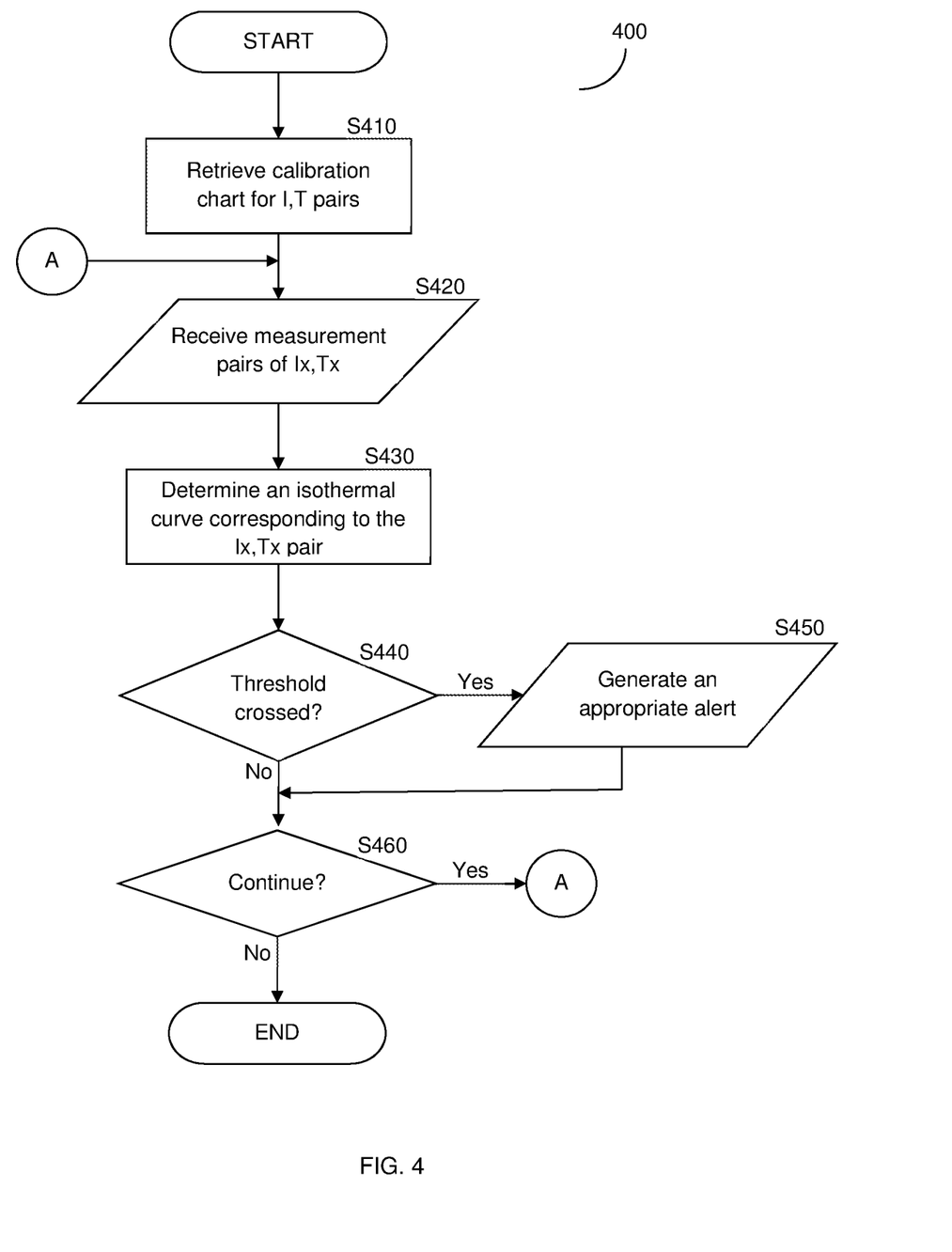
FIG. 4 is a flowchart of a method for providing overheating alerts for a powerline using temperature measurements provided by an SPPS according to an embodiment.

FIG. 4 is an example flowchart 400 of a method for providing overheating alerts for a powerline using temperature measurements provided by an SPPS according to an embodiment. At S410, a calibration chart is retrieved. The calibration chart indicates a powerline temperature for each paring of powerline current and SPPS temperature readings detected from an SPPS connected to a powerline. In an embodiment, the calibration chart is predetermined and saved in a remote or local location, e.g., on a database. The chart may be retrieved from the database over a network connection.

In a further embodiment, S410 may include generating such a calibration table by determining isothermal curves based on powerline current measurements by the SPPS and temperatures as measured by a temperature sensor of the SPPS, as well as a reference temperature sensor coupled to the powerline. An isothermal curve may be generated for an SPPS based on at least two data points, where each data point includes a powerline current reading and an SPPS temperature reading for a particular powerline temperature. Multiple data point each corresponding to the particular powerline temperature may be used to generate the isothermal curves to increase accuracy of the calibration table. In a further embodiment, determining the isotherms curve for an SPPS is based on neighboring SPPSs when isotherm curves and unavailable for the currently used SPPS.

Isothermal calibration charts, such as the chart 300 of FIG. 3, may be individually generated for each SPPS, generated for a group of SPPSs 100-1 through 100-N, or generated for various subgroups of SPPSs, as desired. In an embodiment, the generation of the calibration chart is performed during manufacturing of an SPPS, where a customized chart is generated per individual SPPS. In an additional embodiment, an average calibration curve is produced by measuring one or more SPPS units, for example a sample of units per each production batch, and applying that curve to an entire set of SPPSs.

In another embodiment, the isothermal curves of the calibration charts may have a known dependency on the thickness of the powerline conductor material and/or the thickness of the insulating layer. In such an embodiment, a user may input a parameter indicating, for example, the wire thickness, via a user interface (e.g., via a management server) and the calibration curve S430 can be extrapolated accordingly.

At S420, a pair of measurements is received, e.g., from an SPPS, that include at least a current (e.g., amp) reading and an SPPS temperature reading. In an embodiment, a unique identification of an SPPS is also provided to allow for retrieval and application of a matching calibration chart fitting to that particular SPPS.

At S430, an isothermal curve is determined based on the retrieved chart and the pair of measurements. The determination may be based on the unique identification, e.g., a MAC address, or based on properties of the monitored system, e.g., diameter of conductive material used, if the SPPSs are placed in an enclosed cabinet, and the like. The calibration chart is checked for the proper isothermal curve that fits the current and temperature measurements received, where the determined isothermal curve is indicative of the temperature of the powerline associated with the SPPS. In an embodiment, if a particular isothermal curve is not available in a particular chart, extrapolation from the closest available isothermal curves available on the chart are used based on techniques that are well-known in the art.

At S440, it is determined if a threshold powerline temperature has been exceeded. The threshold powerline temperature may be based on a predetermined value, or may be dynamically set based on predetermined rules. For example, if the ambient temperature is higher than average, the threshold may be raised as well. If it is determined that such threshold has been exceeded, execution continues at S450, where an alert is generated to warn that potential overheating conditions have been detected and execution continues with S460. In an embodiment, an alert is generated when the determined powerline temperature increases relative to the average of a past predetermined period of time by a predetermined percentage or within a predetermined number of standard deviations.

Without limiting the scope of the disclosed embodiments, an alert can be sent to a user via a user interface an may include, but is not limited to, a mobile app notification, a text message (e.g., SMS), an email, a telephone call, or a periodic report.

If no threshold has been exceeded, execution continues with S460. In an embodiment, there may be one or more thresholds, simple or complex, that may be checked in S440, as described hereinabove, without limiting the scope of the disclosed embodiments. In a typical embodiment, the calibrated reading S430 is saved to a database and determining if a threshold has been crossed S440 is done periodically by querying the database and analyzing the result.

In an embodiment, at S440 it is determined if an increase in temperature is identified over a predefined period of time during which current levels running through the powerline drop beyond a threshold, e.g., to half of the previously measured current. In a further embodiment, current fluctuations of the powerline are determined over a period of time, e.g., a percentage drop and hike of current over a period of time. Typically, but not by way of limitation, the current drop or increase is determined as a percent relative to the previous readings of the current through the powerline. Detection of such a case may require the generation of an appropriate alert (at S450) if it is determined that a relevant threshold has been crossed. Such a case may occur when a connection of the powerline, for example, but not by way of limitation, to a power outlet or a circuit breaker, becomes lose or damaged.

At S460, it is checked whether the method should continue its operation. If so execution continues with S420; otherwise, execution terminates.

The various embodiments disclosed herein can be implemented as hardware, firmware, software, or any combination thereof. Moreover, the software is preferably implemented as an application program tangibly embodied on a program storage unit or computer readable medium consisting of parts, or of certain devices and/or a combination of devices. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such a computer or processor is explicitly shown. In addition, various other peripheral units may be connected to the computer platform such as an additional data storage unit and a printing unit. Furthermore, a non-transitory computer readable medium is any computer readable medium except for a transitory propagating signal.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; A and B in combination; B and C in combination; A and C in combination; or A, B, and C in combination.

All examples and conditional language recited herein are intended for pedagogical purposes to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A method for measuring powerline temperature using a self-powered power sensor (SPPS), comprising:
   obtaining a powerline current reading and an SPPS temperature reading from an SPPS, wherein the SPPS is adapted to measure the powerline current as well as receive energy for SPPS operation from the powerline;
   determining the powerline temperature based on an isothermal curve of the powerline current reading and the SPPS temperature reading;
   generating a first alert when the powerline temperature exceeds a predetermined threshold;
   generating a second alert when the determined powerline temperature increases relative to a temperature average of a past predetermined period of time by an indicated amount; and
   generating the isothermal curve for the SPPS based on at least two data points, where each data point includes a powerline current reading and an SPPS temperature reading and wherein the isothermal curve is generated based on at least one of a powerline conductor material type and a powerline conductor material thickness.

2. The method of claim 1, wherein the powerline is a three-phase powerline, the three phases being, respectively, an A phase, a B phase, and a C phase, the powerline comprising at least one respective powerline conductor for each of the A, the B, and the C phases, and wherein the SPPS temperature reading is determined based on a temperature measurement for each of the A, the B and the C powerline conductors of the three-phase powerline.

3. The method of claim 1, further comprising:
   detecting a fluctuation in current running through the powerline over a predetermined period of time.

4. The method of claim 1, further comprising:
   determining the isothermal curve for the SPPS based on an isothermal curve of a neighboring SPPS when the isothermal curve is unavailable for the SPPS.

5. The method of claim 1, wherein any of the first alert and the second alert generated includes at least one of: a mobile app notification, a text message, an email, a telephone call, and a periodic report.

6. A system for measuring powerline temperature using a self-powered power sensor, comprising:
   a processing circuit; and
   a memory, the memory containing instructions that, when executed by the processing circuit, configure the system to:
   obtain a powerline current reading and an SPPS temperature reading from an SPPS, wherein the SPPS is adapted to measure the powerline current as well as receive energy for SPPS operation from the powerline;
   determine the powerline temperature based on an isothermal curve of the powerline current reading and the SPPS temperature reading;
   generate a first alert when the powerline temperature exceeds a predetermined threshold;
   generate a second alert when the determined powerline temperature increases relative to a temperature average of a past predetermined period of time by an indicated amount; and
   generate the isothermal curve for the SPPS based on at least two data points, where each data point includes a powerline current reading and an SPPS temperature reading and wherein the isothermal curve is generated based on at least one of a powerline conductor material type and a powerline conductor material thickness.

7. The system of claim 6, wherein the powerline is a three-phase powerline, the three phases being, respectively, an A phase, a B phase, and a C phase, the powerline comprising at least one respective powerline conductor for each of the A, the B, and the C phases, and wherein the SPPS temperature reading is determined based on a temperature measurement for each of the A, the B and the C powerline conductors of the three-phase powerline.

8. The system of claim 6, wherein the system is further configured to:
   detect a fluctuation in current running through the powerline over a predetermined period of time.

9. The system of claim 6, wherein the system is further configured to:
   determine the isothermal curve for the SPPS based on an isothermal curve of a neighboring SPPS when the isothermal curve is unavailable for the SPPS.

10. The system of claim 6, wherein any of the first alert and the second alert generated includes at least one of: a mobile app notification, a text message, an email, a telephone call, and a periodic report.

11. A method for measuring powerline temperature based on self-powered power sensors (SPPS), comprising:
   generating an isothermal curve for an SPPS based on at least two data points, each data point including a powerline current reading and an SPPS temperature reading, and further based on a powerline conductor material type or thickness, wherein, if the isothermal curve is not available for the SPPS, the isothermal curve is based on one or more neighboring SPPS;
   retrieving a powerline current reading and an SPPS temperature reading from an SPPS;
   determining a powerline temperature based on the isothermal curve of the powerline current reading and the SPPS temperature reading; and
   generating an alert when the powerline temperature exceeds a predetermined threshold.

\* \* \* \* \*